United States Patent
Rolandi et al.

(10) Patent No.: US 7,417,900 B2
(45) Date of Patent: Aug. 26, 2008

(54) METHOD AND SYSTEM FOR REFRESHING A MEMORY DEVICE DURING READING THEREOF

(75) Inventors: Paolo Rolandi, Voghera (IT); Luigi Pascucci, Sesto S. Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/695,552

(22) Filed: Apr. 2, 2007

(65) Prior Publication Data
US 2007/0279996 A1 Dec. 6, 2007

(51) Int. Cl.
*G11C 16/06* (2006.01)

(52) U.S. Cl. ............................ 365/185.25; 365/185.22

(58) Field of Classification Search ............ 365/185.25, 365/185.22, 185.21, 185.2, 222, 233.5
See application file for complete search history.

(56) References Cited

U.S. PATENT DOCUMENTS

| | | | |
|---|---|---|---|
| 4,149,270 A * | 4/1979 | Cricchi et al. ................ | 365/222 |
| 6,188,610 B1 | 2/2001 | Kakizoe et al. | |
| 6,714,479 B2 * | 3/2004 | Takahashi et al. ......... | 365/233.5 |
| 6,898,117 B2 * | 5/2005 | So et al. ................ | 365/185.03 |
| 7,054,197 B2 | 5/2006 | Vimercati | |
| 7,345,905 B2 * | 3/2008 | Pio et al. ..................... | 365/100 |
| 2003/0048665 A1 | 3/2003 | Thomsen et al. | |
| 2006/0209594 A1 | 9/2006 | Pio et al. | |

FOREIGN PATENT DOCUMENTS

| | | |
|---|---|---|
| EP | 1271552 A2 | 1/2003 |
| EP | 1473739 A1 | 11/2004 |
| EP | 1699055 A1 | 9/2006 |

* cited by examiner

*Primary Examiner*—Gene N. Auduong
(74) *Attorney, Agent, or Firm*—Lisa K. Jorgenson; Robert Iannucci; Seed IP Law Group PLLC

(57) ABSTRACT

A refresh circuit for refreshing a memory device is proposed. The refresh circuit includes: reading means for reading a set of memory cells, the reading means including means for applying a biasing voltage having a substantially monotone time pattern to the memory cells and to a set of reference cells each one having a reference threshold voltage, means for detecting the reaching of a comparison current by a cell current of each memory cell and by a reference current of each reference cell, and means for determining a condition of each memory cell according to a temporal relation of the reaching of the comparison current by the corresponding cell current and the reference currents, and writing means for applying a writing voltage to at least one selected of the memory cells; the refresh circuit further includes control means for enabling the writing means during at least part of the application of the biasing voltage after the determination of the condition of each selected memory cell.

21 Claims, 11 Drawing Sheets

METHOD AND SYSTEM FOR REFRESHING A MEMORY DEVICE DURING READING THEREOF

BACKGROUND OF THE INVENTION

1. Field of the Invention

The present invention relates to the memory field. More specifically, the present invention relates to the refresh of memory devices.

2. Description of the Related Art

Memory devices are commonly used to store data in a number of applications; particularly, in a non-volatile memory device the data is preserved even when a power supply is off. Typically, the memory device includes a matrix of memory cells (for example, consisting of floating gate MOS transistors). The memory cells are programmed by injecting electrical charge into their floating gates; conversely, the memory cells are erased by discharging the floating gates. The electrical charge in the floating gate of each memory cell defines different levels of its threshold voltage representing corresponding logical values. Particularly, in a multi-level memory device each memory cell can take more than two levels (and then store a plurality of bits).

The logical values stored in memory cells selected by a corresponding address are read by comparing a current flowing through each selected memory cell with the currents provided by reference cells having predefined threshold voltages. As such, a suitable biasing voltage is applied to the selected memory cells and to the reference cells. In a specific reading technique (as described in U.S. Pat. No. 7,054,197, the entire disclosure of which is herein incorporated by reference) the biasing voltage has a ramp-like time pattern. In this case, the selected memory cells and the reference cells turn on at different times (as soon as the biasing ramp reaches their threshold voltages). The temporal order of the turning on of each selected memory cell with respect to the ones of the reference cells uniquely identifies the logical value stored in the selected memory cell. In this way, the precision of the read operation is strongly improved and made independent of most external factors.

A very critical problem of the memory devices known in the art is their data retention. In fact, the memory cells are subjected to different electrical stresses during operation of the memory devices; these stresses may cause a partial loss of the electrical charge stored in their floating gates, with an undesired erasure of the memory cells that may even cause a change of the logical values stored therein. This problem is particular acute in modern memory devices, wherein the memory cells have very thin oxide layers. Moreover, the problem is exacerbated in multilevel memory devices, wherein the gap between adjacent levels of the threshold voltages is strongly reduced (down to 0.3V); in this case, even a small drift of the threshold voltages of the memory cells (for example, of 0.1V) may change their logical values.

The above-mentioned problem may be addressed by the use of Error Correction Code (ECC) techniques. The ECC adds redundant control information to blocks of logical values (for example, consisting of pages formed by 64 bits). This control information is used for detecting and correcting (if possible) errors in the pages. This allows tolerating some drifts of the threshold voltages of the memory cells without impairing operation of the memory device.

Nevertheless, the structures used to implement the ECC involve a considerable waste of space for storing the control information. Furthermore, the operations required to manipulate the control information slow down operation of the memory device. In addition, the data can be written to and read from the memory device at the level of pages only (because of the need to process the corresponding control information).

A different solution for preventing the loss of data stored in the memory cells is of refreshing their content. For example, it is possible to copy a sector of the memory device onto a volatile memory device, erasing the sector, and then restoring the data from the volatile memory device; however, any power supply cut during the refreshing operation would cause the complete loss of the data stored in the volatile memory device, and then the impossibility of restoring it onto the non-volatile memory device.

The refresh operation may also be performed individually for each memory cell (directly on the memory device). The threshold voltage of the memory cell is compared with both read references (discriminating the different logical values that can be stored therein) and corresponding guard references (each one slightly higher than a corresponding read reference). In this way, a warning condition of the memory cell can be detected when its threshold voltage is comprised between any read reference and the corresponding guard reference (meaning that the memory cell has lost electrical charge and then it is dangerously approaching the read reference of its logical value). In this case, a soft-program pulse is applied to the memory cell, so as to inject a small amount of electrical charge into its floating gate (until the correct threshold voltage of the memory cell over the guard reference has been restored).

The refresh operation is typically performed periodically (for example, after a predetermined number of operations executed on the memory device). Alternatively, it has also been proposed to verify the condition of each memory cell whenever it is read; in this case, the memory cell is refreshed immediately after the read operation (when it is necessary). For example, this technique is described in EP-A-1271552.

In any case, the refresh operation takes a relatively long time. Particularly, the choice of performing it periodically requires stopping operation of the memory device for the whole period that is necessary to refresh all the memory cells; therefore, this procedure may be untenable in most practical situations. Conversely, when the memory cells are refreshed after their reading the corresponding access time is significantly increased (since the memory cells are not available until completion of the refresh operation); this has a detrimental impact on the performance of the whole memory device.

All of the above limits the application of the refresh operation; therefore, this may impair the reliability of the memory device.

BRIEF SUMMARY OF THE INVENTION

One embodiment of the present invention is based on the idea of refreshing the memory device during its reading.

One embodiment of the present invention provides a solution as set out in the independent claims. Advantageous embodiments of the invention are described in the dependent claims.

More specifically, an embodiment of the invention provides a refresh circuit (for refreshing a memory device). The refresh circuit includes reading means that is used to read a set of memory cells. The reading means includes means for applying a biasing voltage having a substantially monotone time pattern (such as a ramp) to the memory cells and to a set of reference cells (each one having a reference threshold voltage). Means is provided for detecting the reaching of a comparison current by a cell current (of each memory cell) and by a reference current (of each reference cell). The reading means further includes means for determining a condition of each memory cell, according to a temporal relation of the reaching of the comparison current by the corresponding cell current and the reference currents. Writing means is provided for applying a writing voltage (such as a soft-program pulse) to at least one selected of the memory cells. The refresh circuit further includes control means for enabling the writing means during the application of the biasing voltage (or a part thereof), after the determination of the condition of each selected memory cell.

Typically, the refresh operation is performed on the memory cells that are in a warning condition.

It is possible to exploit additional reference cells with (guard) threshold voltages.

A specific implementation of a circuit that can be used to detect the warning condition is also proposed.

Alternatively, the same result is achieved by delaying the detection of the reaching of the comparison current by each reference current.

In this embodiment as well, a specific implementation of a circuit that can be used to detect the warning condition is proposed.

In an embodiment of the invention, each selected memory cell is soft-programmed immediately (after the determination of its condition) up to the completion of the read operation.

In a different embodiment of the invention, the selected memory cell is still soft-programmed immediately, but for a predetermined period.

In a further embodiment of the invention, the selected memory cells are always soft-programmed at the same time (towards the end of the read operation).

Another embodiment of the invention proposes a memory device including the refresh circuit.

A further embodiment of the invention proposes a corresponding method.

BRIEF DESCRIPTION OF THE SEVERAL
VIEWS OF THE DRAWINGS

The invention itself, as well as further features and the advantages thereof, will be best understood with reference to the following detailed description, given purely by way of a non-restrictive indication, to be read in conjunction with the accompanying drawings, in which.

DETAILED DESCRIPTION OF THE INVENTION

Figure 1:
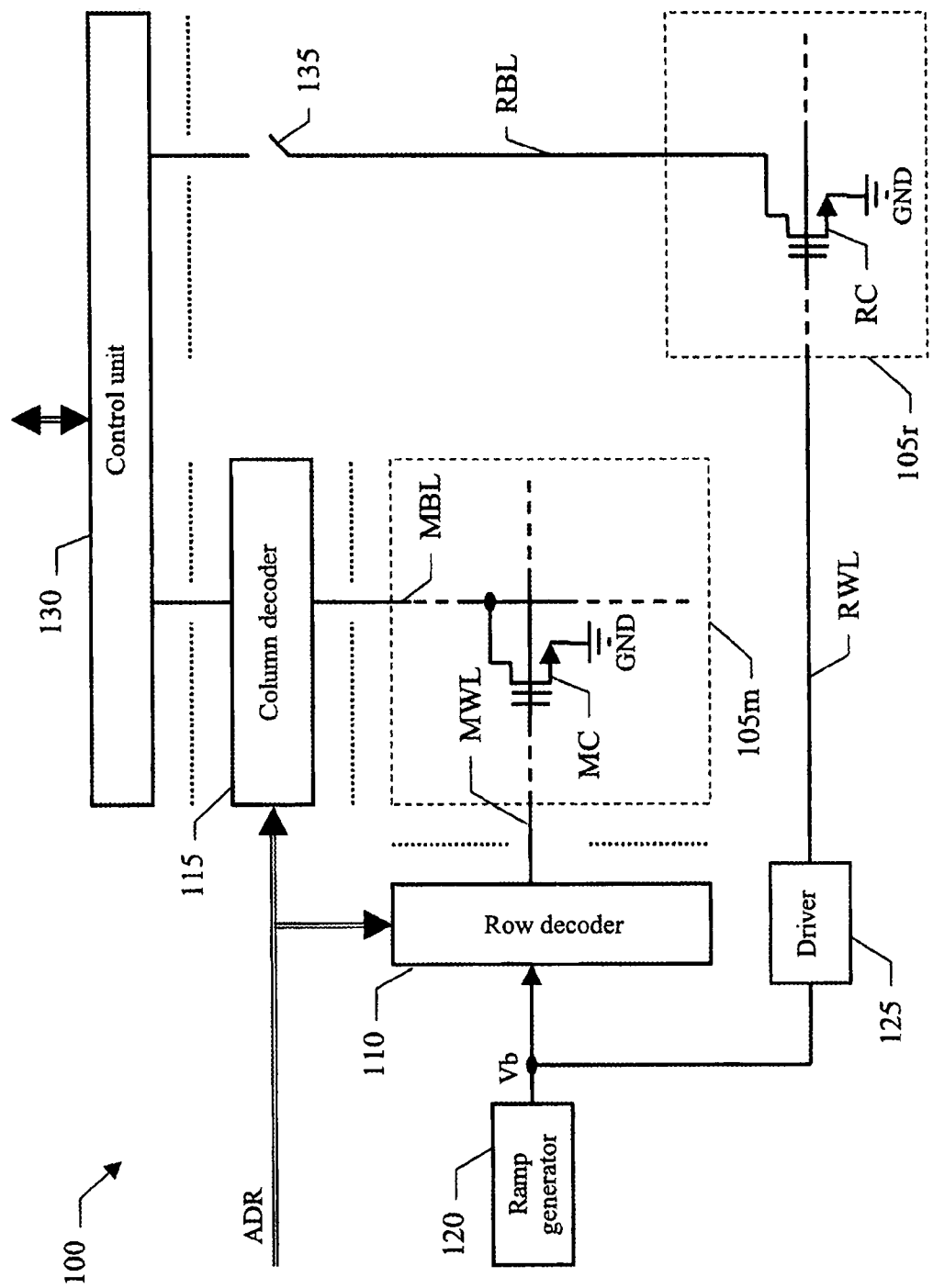
FIG. 1 is a conceptual representation of a memory device in which the solution according to an embodiment of the invention is applicable.

With reference in particular to FIG. 1, a non-volatile memory device 100 (for example, consisting of a flash $E^2PROM$) is illustrated. The memory device 100 is integrated in a chip of semiconductor material, and includes one or more sectors (only one shown in the figure), each one formed by a matrix 105$m$ of memory cells MC. Each memory cell MC consists of a floating gate MOS transistor with a programmable threshold voltage. The memory cell MC in a non-programmed (or erased) condition exhibits a low threshold voltage. The memory cell MC is programmed by injecting electrical charge into its floating gate; the memory cell MC can be programmed to multiple levels, each one associated with a corresponding range of its threshold voltage. Each level represents a different logical value; for example, the memory device 100 operates at 4 levels, so that each memory cell MC stores a logical value consisting of 2 bits (11, 10, 01 and 00 for increasing threshold voltages). Conversely, the memory cells MC are erased by removing the electrical charges trapped in their floating gates.

In the example at issue, the matrix 105$m$ has a so-called NOR architecture. Particularly, the drain terminals of the memory cells MC of each column are connected to a corresponding bit line MBL, whereas the control gate terminals of the memory cells MC of each row are connected to a corresponding word line MWL; the source terminals of all the memory cells MC are connected to a common terminal providing a reference voltage (or ground) GND. All the memory cells MC of the matrix 105$m$ are erased at the same time. On the other hand, the memory device 100 simultaneously reads/programs a word (for example, consisting of 16 bits). The bits of each word are stored in a page of memory cells MC (16/2=8 in the example at issue), which are associated with a single word line MWL; the bit lines MBL of the matrix 105$m$ are grouped into 8 packets, each one associated with a different memory cell MC of every pages.

The memory device 100 further includes a (single row) matrix 105$r$ of reference cells RC, which are used for discriminating the different conditions of the memory cells MC. Each reference cell RC consists of a floating gate MOS transistor (substantially the same as the ones of the memory cells MC) with a threshold voltage (typically set at the manufacturing of the memory device 100). The drain terminal of each reference cell RC is connected to a corresponding bit line RBL; the control gate terminals of all the reference cells RC are connected to a common word line RWL, whereas their source terminals are connected to the ground terminal GND.

The memory device 100 receives an address ADR for accessing a corresponding page. A portion of the address ADR is supplied to a row decoder 110, which selects the desired word line MWL. Another portion of the address ADR is supplied to a column decoder 115, which selects the desired bit line MBL in each packet. The memory device 100 further includes a ramp generator 120; the ramp generator 120 provides a biasing voltage Vb having a ramp-like pattern (i.e., with its value that increases linearly over time according to a constant slope). The ramp generator 120 may be of the analogue type (wherein the voltage of the biasing ramp Vb rises continuously) or of the digital type (wherein the voltage of the biasing ramp Vb rises at discrete intervals, with a step-like pattern approximating the desired ramp); in the latter case, the ramp generator 120 is generally implemented by means of a counter (incremented at a frequency), which counter drives a Digital-to-Analog Converter (DAC).

The row decoder 110 couples the selected word line MWL with the ramp generator 120, so as to apply the biasing ramp Vb to the control gate terminals of the selected memory cells MC. The same biasing ramp Vb is also applied to the word line RWL through a driver 125 (which emulates the same loading conditions of the row decoder 110); in this way, the control gate terminals of all the reference cells RC receive the biasing ramp Vb in the same conditions as the selected memory cells MC.

The column decoder 115 connects the selected bit lines MBL to a control unit 130; the control unit 130 is also coupled with each bit line RBL through a corresponding switch 135. The control unit 130 includes all the circuits required to perform any read, program and erase operation on the memory device 100.

Figure 2:
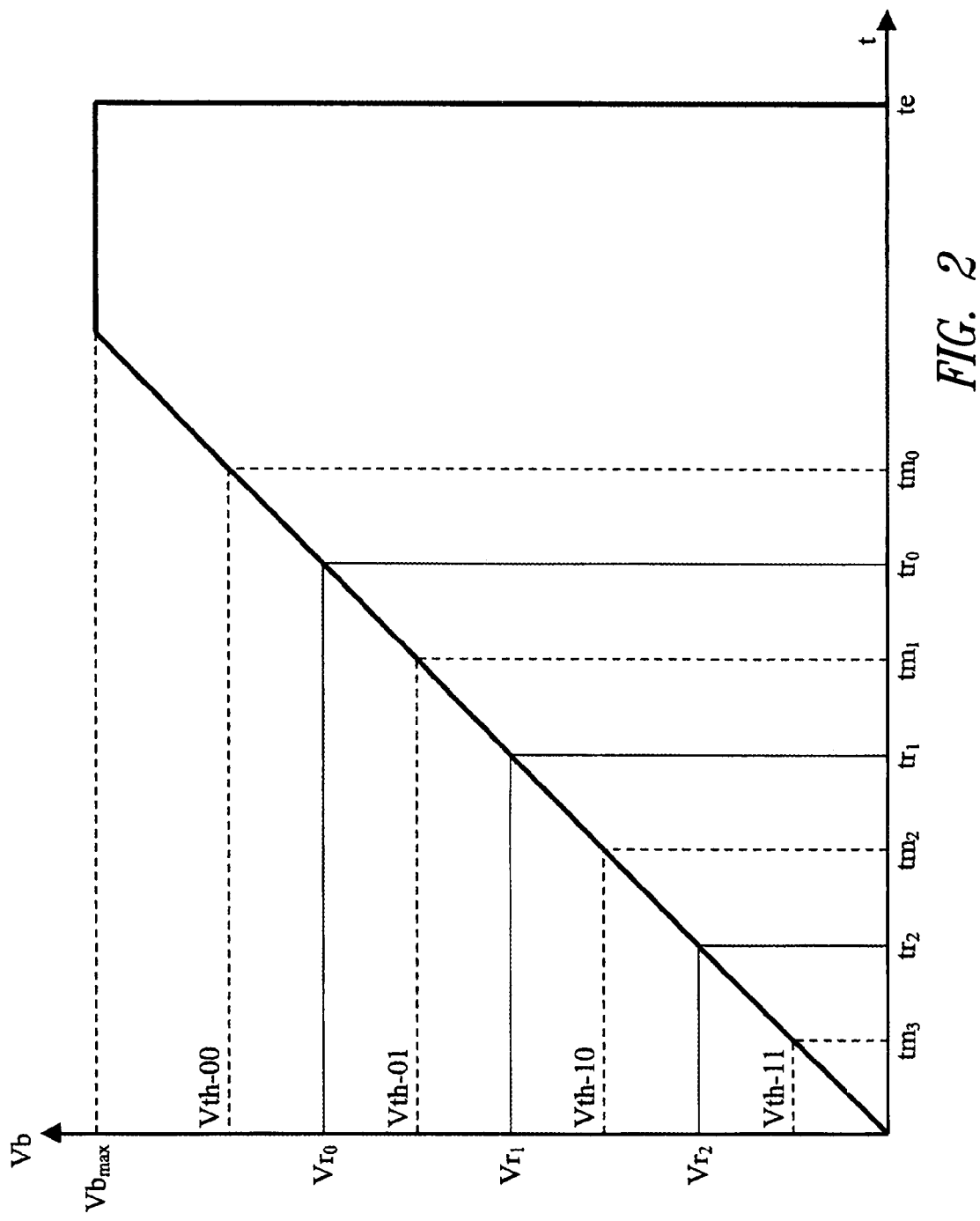
FIG. 2 shows an illustrative time diagram explaining a read operation executed on the memory device.

Considering now FIG. 2, during a read operation the (unknown) threshold voltage of each selected memory cell MC (denoted with Vth) is compared with the ones of three (read) reference cells, denoted with $RCr_i$ (i=0-2). The threshold voltage of each read reference cell $RCr_i$ is equal to a read reference $Vr_i$ comprised between the levels of the logical values i+1 and i; more specifically, the read reference $Vr_2$ is comprised between the levels of the logical values 11 and 10, the read reference $Vr_1$ is comprised between the levels of the logical values 10 and 01, and the read reference $Vr_0$ is comprised between the levels of the logical values 01 and 00.

The biasing ramp Vb increases over time (t) from the ground voltage GND (0V) to a maximum value (denoted with $Vb_{max}$) exceeding the highest read reference $Vr_0$; for example, the biasing ramp Vb has a slope of $100 \exists 10^6$ V/s and a length of 30-40 ms, so as to reach the maximum value $Vb_{max}$=3-4V. The biasing ramp Vb then remains at the maximum value $Vb_{max}$ for a further period required to complete the read operation (up to a time te, of the order to 50-60 ns).

When the biasing ramp Vb reaches the threshold voltage of the first read reference cell $RCr_2$ (i.e., the read reference $Vr_2$) at a time $tr_2$, this read reference cell $RCr_2$ turns on; the other read reference cells $RCr_1$ and $RCr_0$ turn on in succession when the biasing ramp Vb reaches the read reference $Vr_1$ at a time $tr_1$ and the read reference $Vr_0$ at a time $tr_0$, respectively.

Likewise, the (selected) memory cell MC turns on when the biasing ramp Vb reaches its threshold voltage Vth. Therefore, if this time (denoted with $tm_3$) precedes the time $tr_2$, the threshold voltage Vth is lower than the read reference $Vr_2$; this means that the memory cell MC stores the logical value 11. Instead, if the turn on time of the memory cell MC (denoted with $tm_2$) follows the time $tr_2$ but precedes the time $tr_1$, the threshold voltage Vth is comprised between the read references $Vr_2$–$Vr_1$ and the memory cell MC stores the logical value 10, whereas if the same time (denoted with $tm_1$) follows the time $tr_1$ but precedes the time $tr_0$, the threshold voltage Vth is comprised between the read references $Vr_1$–$Vr_0$ and the memory cell MC stores the logical value 01. At the end, if the turn on time of the memory cell MC (denoted with $tm_0$) follows the time $tr_0$, or the memory cell MC does not turn on before the time te (with the biasing ramp Vb at its maximum value $Vb_{max}$ higher than the last read reference $Vr_0$), the threshold voltage Vth is higher than the read reference $Vr_0$ and the memory cell MC stores the logical value 00.

Figure 3A:
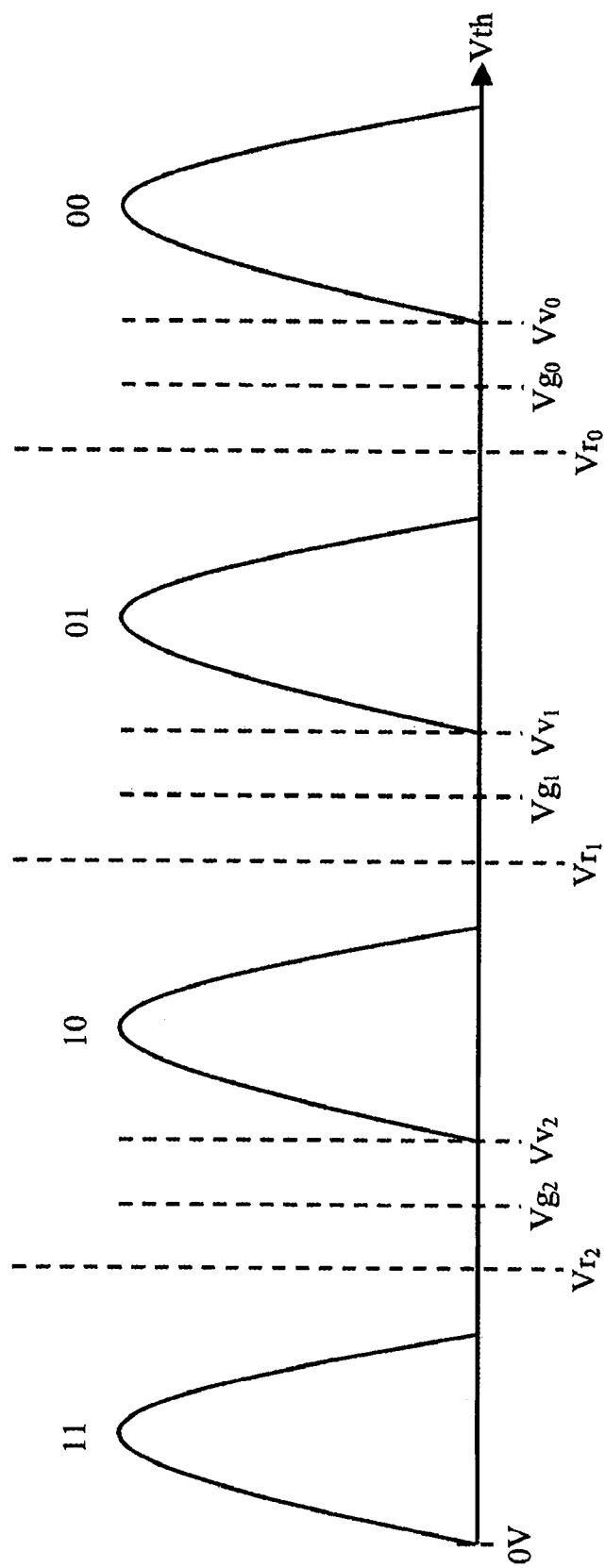
FIG. 3A illustrates an exemplary distribution of the threshold voltage of a generic memory cell.

The same procedure can also be used to verify the condition of the memory cell MC. Indeed, as shown in FIG. 3a, whenever the memory cell MC is programmed to any logical value 10, 01 or 00, its threshold voltage Vth is brought over a program-verify reference $Vv_i$ slightly higher than the corresponding read reference $Vr_i$. Therefore, when the memory cell MC stores the i-th logical value its threshold voltage Vth is distributed over the verify reference $Vv_i$, below the read reference $Vr_{i-1}$ of the next logical level (with the threshold voltage Vth that is distributed below the read reference $Vr_2$ for the logical value 11). In this way, the ranges of the threshold voltage Vth of the memory cell MC associated with the different logical values 11-00 are spaced apart; this facilitates the identification of the level of the threshold voltage Vth and then of the logical value stored in the memory cells MC, so as to increase the reliability of the read operation.

When the memory cell MC looses the electrical charge trapped in the floating gate, its threshold voltage Vth decreases accordingly. As a result, should the threshold voltage Vth fall below the read reference $Vr_i$ of the logical value originally stored in the memory cell MC, the threshold voltage Vth would enter the range of the lower level so as to cause the reading of a wrong logical value.

In order to prevent this situation, a guard reference $Vg_i$ is associated with each read reference $Vr_i$; the guard reference $Vg_i$ is comprised between the read reference $Vr_i$ and the verify reference $Vv_i$, and defines a safe margin for the threshold voltage Vth. In this way, it is possible to detect a warning condition of the memory cell MC when its threshold voltage Vth reaches the guard reference $Vg_i$ of the logical value stored therein (meaning that the memory cell MC is approaching the read reference $Vr_i$ because of the loss of electrical charge).

Figure 3B:
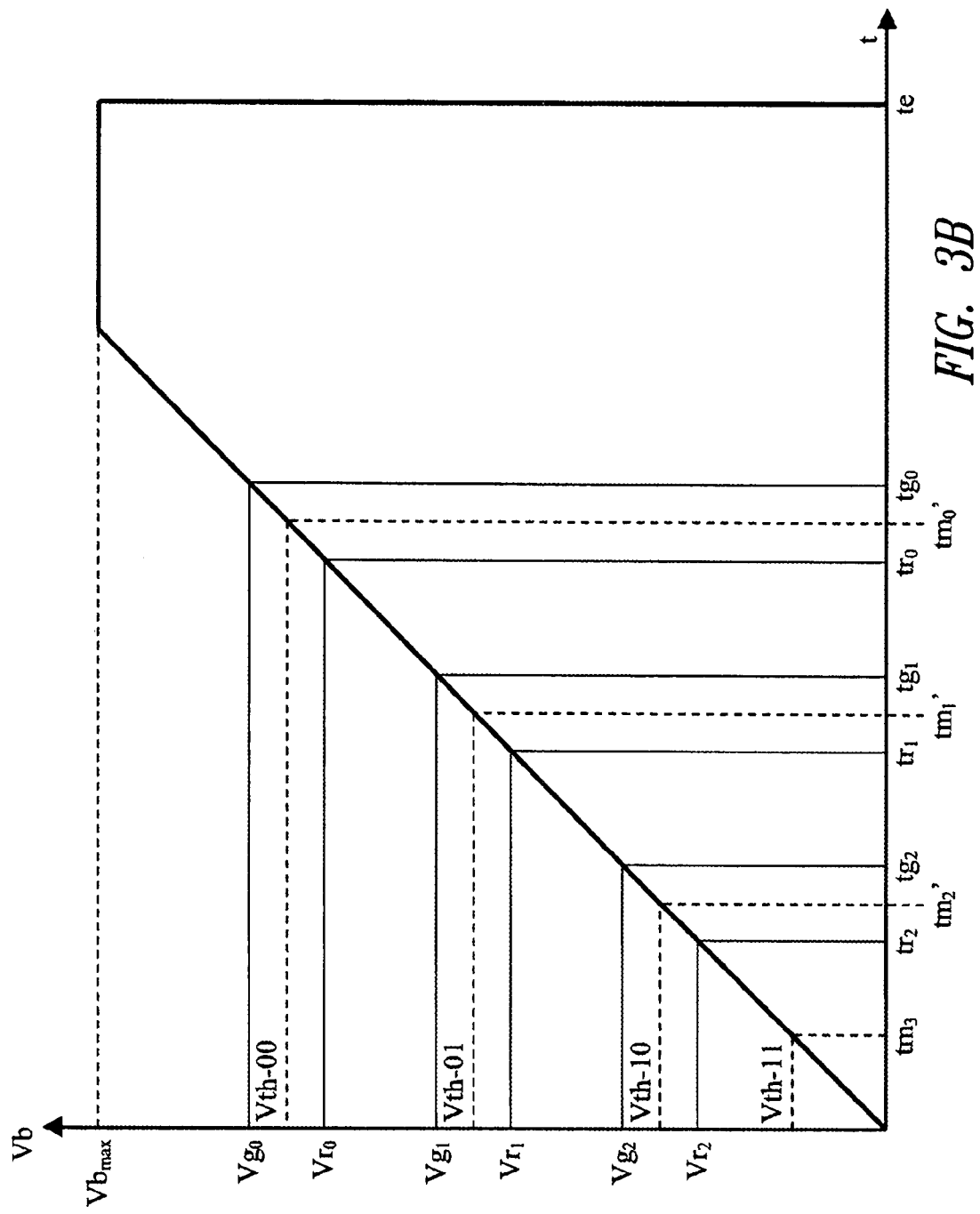
FIG. 3B shows an illustrative time diagram explaining a read operation according to an embodiment of the invention.

According to one embodiment, as illustrated in FIG. 3b, during the above-described read operation the threshold voltage Vth of the memory cell MC is further compared with the ones of three (guard) reference cells, denoted with $RCg_i$; the threshold voltage of each guard reference cell $RCg_i$ is equal to the guard reference $Vg_i$.

As above, when the biasing ramp Vb reaches the threshold voltage of the guard reference cell $RCg_2$ (i.e., the guard reference $Vg_2$) at a time $tg_2$ following the time $tr_2$, this guard reference cell $RCg_2$ turns on; the other guard reference cells $RCg_1$ and $RCg_0$ turn on in succession when the biasing ramp Vb reaches the guard reference $Vg_1$ at a time $tg_1$ (following the time $tr_1$) and the guard reference $Vg_0$ at a time $tg_0$ (following the time $tr_0$), respectively.

Therefore, if the time (denoted with $tm_i'$) when the memory cell MC turns on follows a generic time $tr_i$ but precedes the time $tg_i$, its threshold voltage Vth is comprised between the read reference $Vr_i$ and the guard reference $Vg_i$; this means that the memory cell MC still stores the i-th logical value, but it has entered the corresponding warning condition.

In the solution according to an embodiment of the invention, the memory cell MC (in the warning condition) is then subjected to a refresh operation. According to one embodiment, a soft-program pulse Vp is applied to the memory cell MC (and more specifically to its drain terminal), so as to inject a small amount of electrical charge into the corresponding floating gate. The soft-program pulse Vp starts after the occurrence of the event that allows determining the condition of the memory cell MC (i.e., the entering the corresponding warning condition); this event consists of the turn on of the guard reference cell $RCr_i$ (when the memory cell MC has turned on after the corresponding read reference cell $RCr_i$). The soft-program pulse Vp is applied (to the drain terminal of the memory cell MC) while it receives the biasing ramp Vb (at its control gate terminal). The soft-program pulse Vp has a value (for example, 4-5V) so that its combined action with the biasing ramp Vb slightly increases the threshold voltage Vth of the memory cell MC (for example, by 5-20 mV). In this way, the threshold voltage Vth of the memory cell MC returns over the guard reference $Vg_i$ associated with its logical value (thereby leaving the corresponding warning condition), or at least moves towards the guard reference $Vg_i$ (away from the corresponding read reference $Vr_i$).

The proposed solution avoids any waste of time for the refresh operation. Indeed, the time that is required in any case to complete each read operation is now exploited to refresh the same memory cells being read. In this way, the memory device implements a "shadow" refreshing, which is completely opaque to its operation.

As a result, it is possible to refresh the memory cells without having to stop operation of the memory device. At the same time, the refresh operation does not have any impact on the access time of the memory device.

All of the above fosters the widespread application of the refresh operation; this has a beneficial impact on the reliability of the memory device.

It should also be noted that the pattern of the biasing ramp Vb automatically ensures that the electrical field at the oxide layer of the memory cells MC is kept substantially constant while the electrical charge in their floating gates increases (during the refresh operation). Moreover, in this way the desired result is achieved with very low additional power consumption (being the biasing ramp Vb already available).

Figure 4A:
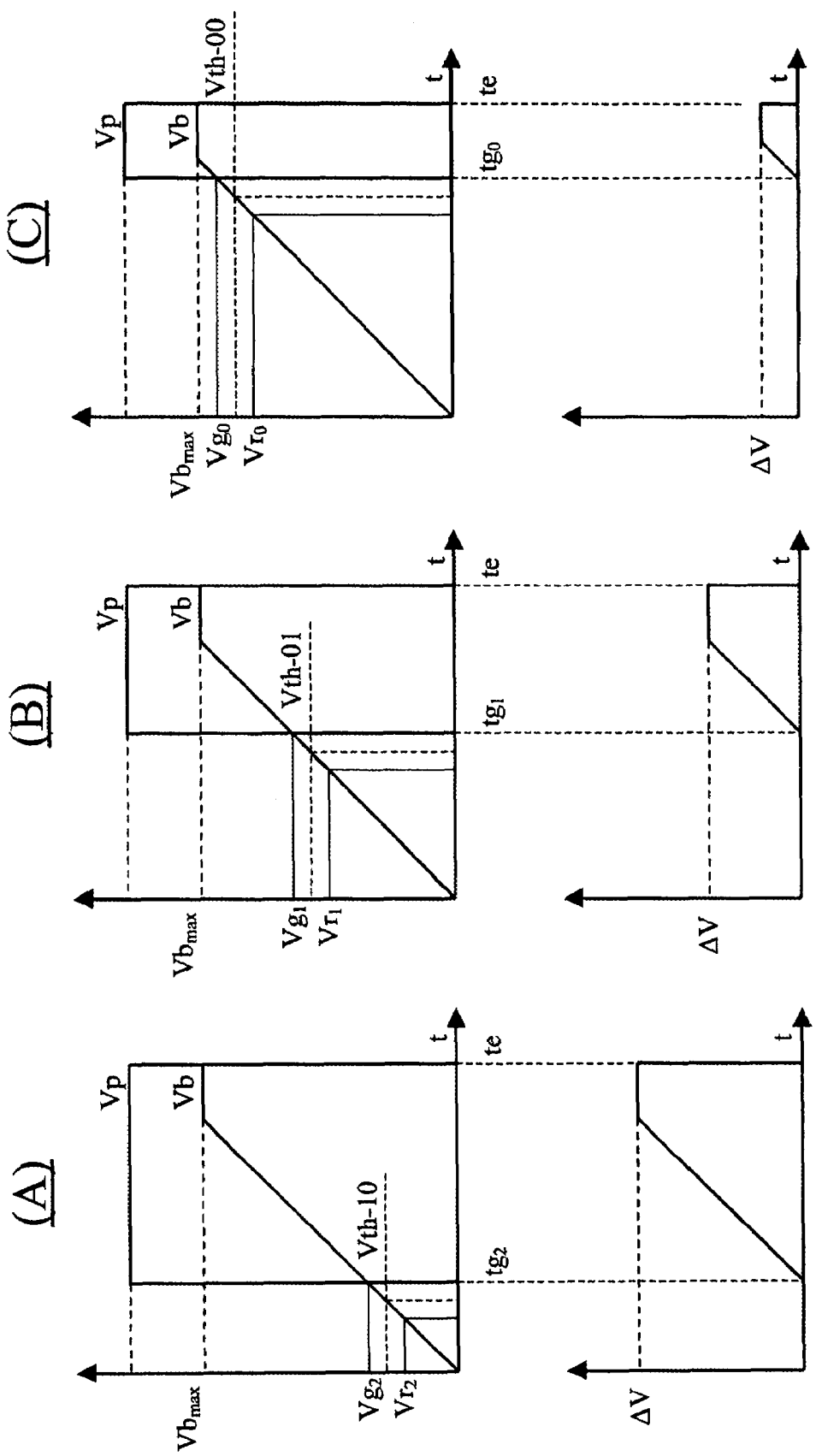
FIGS. 4A-4C are illustrative time diagrams of a refresh operation according to different embodiments of the invention.

The soft-program pulse Vp may be generated with different techniques. With reference in particular FIG. 4a, in an embodiment of the invention the soft-program pulse Vp is applied to the memory cell MC immediately (after the determination of its condition) up to the completion of the read operation. For example, when the memory cell MC stores the logical value 10 but has entered the corresponding warning condition (case A), the soft-program pulse Vp lasts from the time $tg_2$ (when the guard reference cell $RCg_2$ turns on) to the time te (when the biasing ramp Vb ends). Likewise, when the memory cell MC is in the warning condition of the logical value 01 (case B), the soft-program pulse Vp lasts from the time $tg_1$ to the time te, whereas when the memory cell MC is in the warning condition of the logical value 00 (case C), the soft-program pulse Vp lasts from the time $tg_0$ to the time te. The figure also shows a voltage overdrive $\Delta V$ at the control gate terminal of the memory cell MC (defined as the difference between the biasing ramp Vb applied thereto and its threshold voltage Vth).

The proposed implementation exploits the time available during the read operation to the utmost. However, the memory cells MC with the higher threshold voltages Vth receive the soft-program pulse Vp for a shorter period and with a lower voltage overdrive $\Delta V$ (so that the effectiveness of the refresh operation is non-uniform).

Figure 4B:
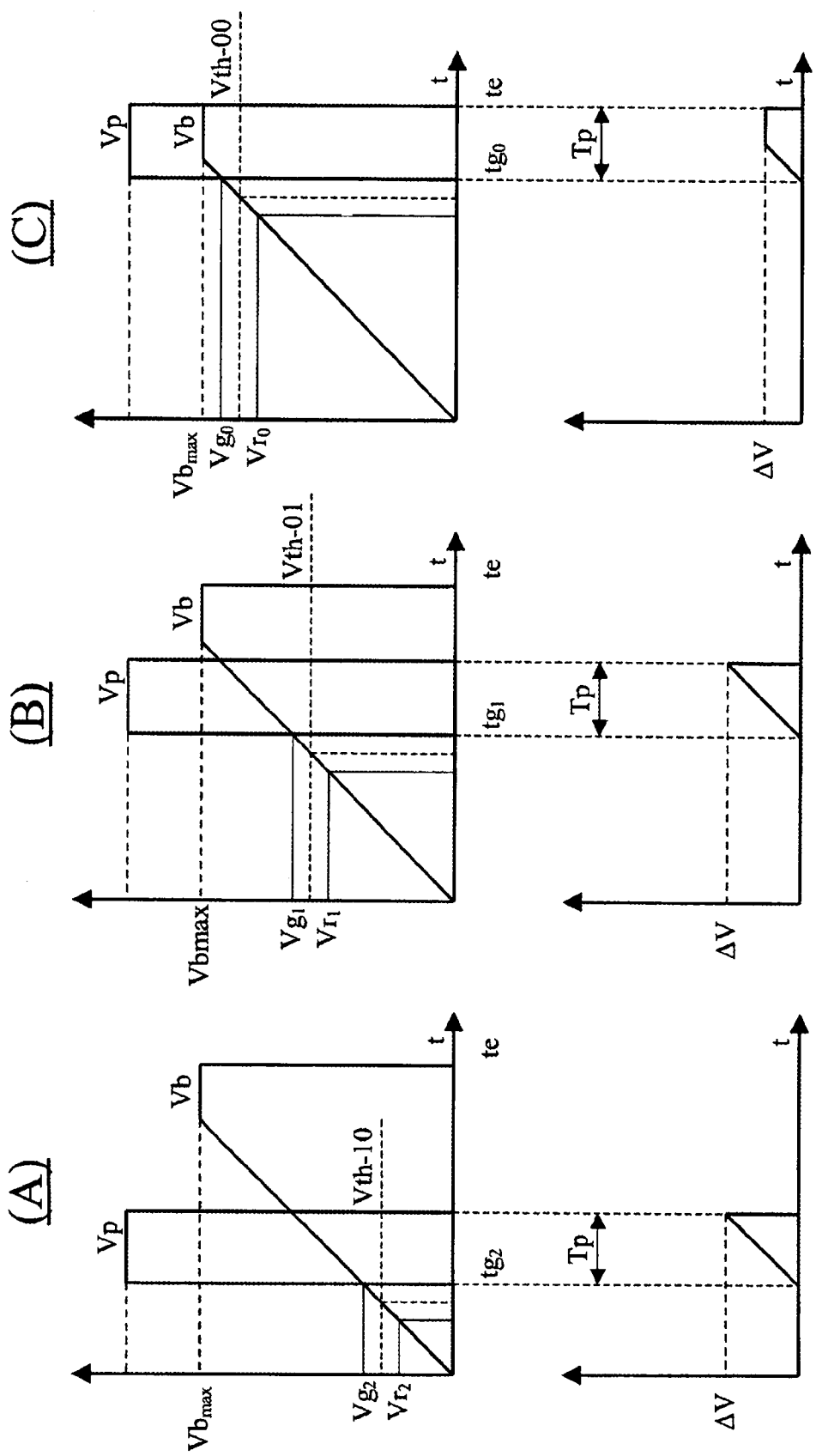

Moving to FIG. 4b, in a different embodiment of the invention the soft-program pulse Vp is still applied to the memory cell MC immediately (after the determination of its condition), but for a predetermined period Tp. More specifically, in all the cases described in the foregoing (A, B and C) the soft-program pulse Vp lasts from the time $tg_i$ to the time $tg_i+Tp$. According to one embodiment, the period Tp is set to allow the completion of the soft-program pulse Vp in every condition (i.e., even for the memory cells MC with the highest threshold voltages Vth); therefore, the period Tp is at most equal to $Tp=te-tg_0$. As above, the figure also shows the corresponding voltage overdrive $\Delta V$ at the control gate terminal of the memory cell MC.

In this implementation, the effectiveness of the refresh operation is substantially uniform. Indeed, both the length of the soft-program pulse Vp and the voltage overdrive $\Delta V$ (disregarding the difference due to the final steady portion of the biasing ramp Vb) are independent of the threshold voltages Vth of the memory cells MC. However, the time available during the read operation is now exploited only partially.

Figure 4C:
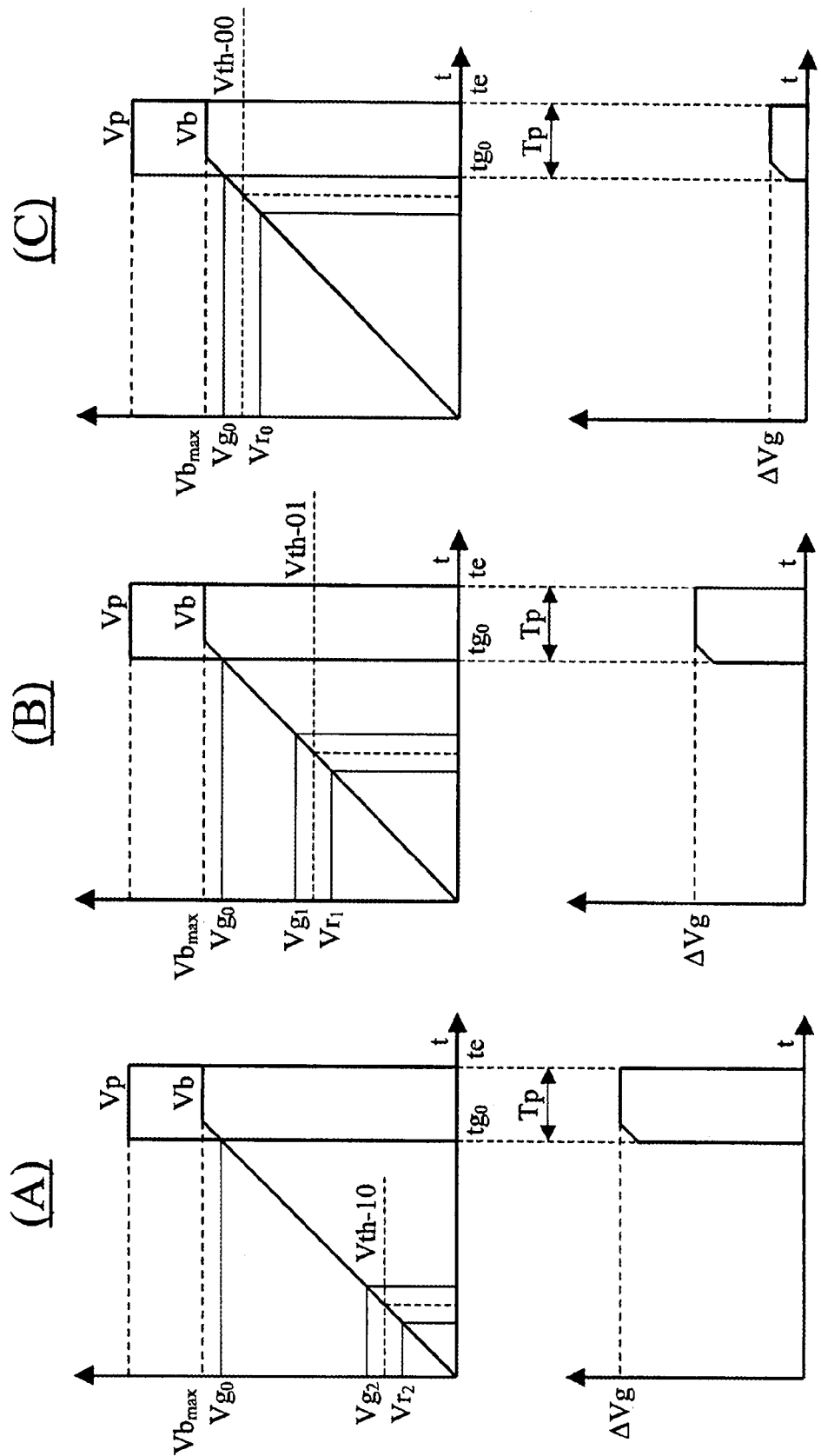

In a further embodiment of the invention, as shown in FIG. 4c, the soft-program pulse Vp is now applied at the same time to all the memory cells MC for the same period Tp. More specifically, in all the cases described in the foregoing (A, B and C) the soft-program pulse Vp lasts from the time $tg_0$ (when the last guard reference cell $RCg_0$ turns on) to the time $tg_0+Tp$, and preferably up to the completion of the read operation (i.e., to the time te). As above, the figure also shows the corresponding voltage overdrive $\Delta V$ at the control gate terminal of the memory cell MC.

In the proposed implementation, the length of the soft-program pulse Vp is still independent of the threshold voltages Vth of the memory cells MC; the voltage overdrive $\Delta V$ is now the highest possible in any condition (even if it is not uniform for the different threshold voltages Vth). As above, this result is achieved with a reduction of the time available during the read operation that is exploited.

Figure 5:
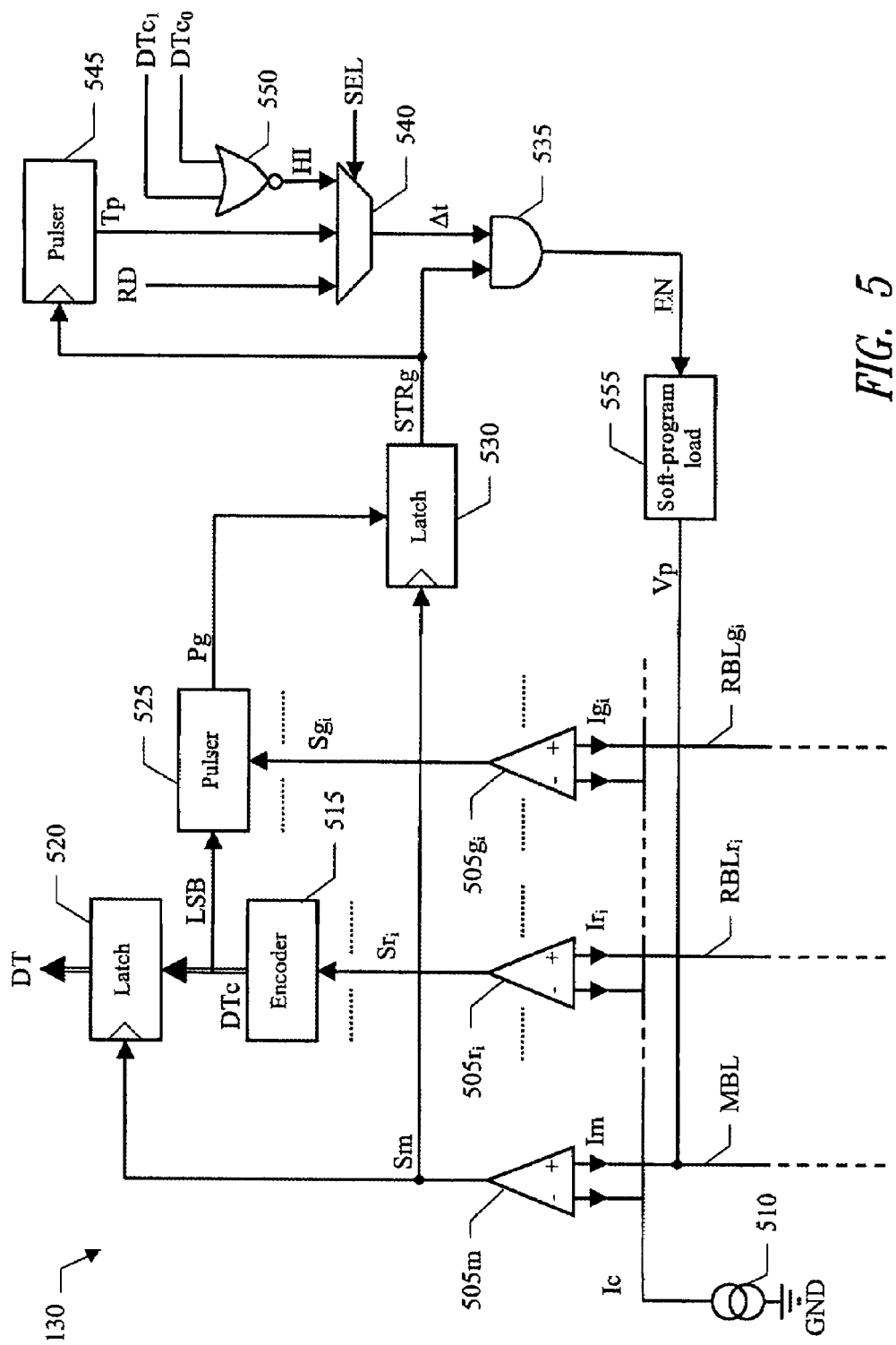
FIG. 5 is a schematic block diagram of a control unit of the memory device that can be used to implement the solution according to an embodiment of the invention.

Moving now to FIG. 5, the control unit 130 is formed by the same structure repeated for each packet of bit lines MBL. Particularly, this structure includes a sense amplifier 505m for the (selected) memory cell MC, a sense amplifier $505r_i$ for each read reference cell $RCr_i$, and a sense amplifier $505g_i$ for each guard reference cell $RCg_i$ (which sense amplifiers 505m, $505r_i$,$505g_i$ bias the cells MC,$RCr_i$,$RCg_i$ to a common read voltage, such as 1V). The non-inverting input terminal of the sense amplifier 505m receives a current Im flowing through the selected bit line MBL (and then through the selected memory cell MC). The non-inverting input terminal of each sense amplifier $505r_i$ receives a current $Ir_i$ flowing through the bit line (denoted with $RBLr_i$) associated with the read reference cell $RCr_i$; likewise, the non-inverting input terminal of each sense amplifier $505g_i$ receives a current $Ig_i$ flowing through the bit line (denoted with $RBLg_i$) associated with the guard reference cell $RCg_i$. The inverting input terminals of all the sense amplifiers 505m, $505r_i$ and $505g_i$ instead receive a comparison current Ic; the comparison current Ic is provided by a direct current generator 510 (referred to the ground terminal GND), and has a value lower than the current flowing through every memory/reference cell MC, $RCr_i$, and $RCg_i$ when conductive (for example, about 5-20 ③A). The output terminals of the sense amplifiers 505m, $505r_i$ and $505g_i$ provide a sensing bit Sm, $Sr_i$, and $Sg_i$, respectively; the sensing bits Sm,$Sr_i$,$Sg_i$ are asserted (for example, at the logical value 1) when the corresponding currents Im,$Ir_i$,$Ig_i$ exceed the comparison current Ic.

The sensing bits $Sr_i$ (from the sense amplifiers $505r_i$) are provided to an encoder 515; the encoder 515 converts the sensing bits $Sr_i$ into a running value DTc, which represents the current logical value that would be stored in the memory cell MC at every instant during the read operation. Particularly (as shown in FIG. 2), at the beginning of the read operation all the sensing bits $Sr_0$-$Sr_2$ are deasserted, and the running value DTc is equal to 11; the running value DTc then switches to 10, 01 and 00 at the assertion of the sensing bit $Sr_2$ (time $tr_2$), of the sensing bit $Sr_1$ (time $tr_1$) and of the sensing bit $Sr_0$ (time $tr_0$), respectively. Preferably, the encoder 515 also latches each sensing bit $Sr_i$; in this way, once the turn on of the corresponding read reference cell $RCr_i$ has been detected (i.e., the sensing bit $Sr_i$ has been asserted), this reference cell $RCr_i$ can be turned off by means of the respective switch (so as to reduce the power consumption of the memory device and any noise caused by the current drained from the common ground terminal GND). The running value DTc is saved into a latch 520, in response to the assertion of the sensing bit Sm; in this way, the latch 520 provides the logical value actually stored in the memory cell MC (denoted with DT). As above, once the turn on of the memory cell MC has been detected (i.e., the sensing bit Sm has been asserted), the memory cell MC can be turned off by means of the column decoder; however, the biasing ramp Vb is maintained up to the end of the read operation to detect the condition of the other memory cells CM in the selected page.

On the other hand, the sensing bits $Sg_i$ (from the sense amplifiers $505g_i$) are provided to a pulser 525, which also receives the Least Significant Bit (LSB) of the running value DTc (from the encoder 515). As described in detail in the following, the pulser 525 generates a guard pulse Pg that lasts from any toggle of the bit LSB (when the running value DTc changes following the turn on of a next reference cell $RCr_i$) up to the assertion of the corresponding sensing bit $Sg_i$ (when the guard cell $RCg_i$ turns on as well); in other words, the guard pulse Pg is asserted when the memory cell MC would be in any warning condition at every instant during the read operation. Preferably, the pulser 525 also latches each sensing bit $Sg_i$, so as to allow turning off the corresponding guard reference cell $RCg_i$ once its turn on has been detected. The guard pulse Pg is saved into a latch 530, in response to the assertion of the sensing bit Sm. The latch 530 outputs a guard strobe STRg, which is then asserted only when the memory cell MC has turned on between the turn on of a generic read reference cell $RCr_i$ and of the corresponding guard reference cell $RCg_i$ (i.e., it is in the respective warning condition); in this case, a refresh operation is performed on the memory cell MC.

According to one embodiment, the guard strobe STRg is input to an AND gate 535; the AND gate 535 also receives a signal ΔT, which is asserted for the desired length of the soft-program pulse Vp to be applied to the memory cell MC. The length signal ΔT is provided by a multiplexer 540, which receives three different signals (specifying the length of the soft-program pulse Vp according to the embodiments of the invention described in the foregoing with reference to FIGS. 4a-4c); the multiplexer 540 transmits one of them (so as to define the length signal ΔT), in response to a selection signal SEL that is set to the desired mode of operation of the memory device (for example, stored in a configuration register).

Particularly, when the soft-program pulse Vp is applied immediately up to the completion of the read operation (see FIG. 4a), the multiplexer 540 transmits a read signal RD that is asserted for the whole read operation. On the other hand, when the soft-program pulse Vp is still applied immediately but for the predetermined period Tp (see FIG. 4b), the multiplexer 540 transmits a signal denoted with the same reference (Tp), which is asserted for the length of that period; the period signal Tp is generated by a pulser 545, which asserts the period signal Tp (for the desired time) in response to the assertion of the guard strobe STRg. At the end, when the soft-program pulse Vp is applied at the end of the read operation (see FIG. 4c), the multiplexer 540 transmits a top signal HI that is output by a NOR gate 550; the NOR gate 550 receives the two bits of the running value DTc (denoted with $DTc_0$ and $DTc_1$), so that the top signal HI is asserted when the last read reference cell $RCr_0$ turns on (running value DTc=00) until the completion of the read operation.

In any case, the AND gate 535 outputs an enabling signal EN, which is asserted for the length defined by the signal ΔT whenever the threshold voltage of the memory cell MC is in any warning condition (guard strobe STRg asserted). The signal EN enables a soft-program load 555. While the enabling signal EN is asserted, the soft-program load 555 applies the soft-program pulse Vp to the bit line MBL (and then to the drain terminal of the memory cell MC). For example, the soft-program load 555 connects the bit line MBL to a charge pump (not shown in the figure), which generates the high voltage of the soft-program pulse Vp (4-6V) from a lower power supply voltage +Vdd of the memory device (for example, 2-3V); it should be noted that the charge pump typically has a driving capability far higher than the one of the sense amplifier 505m, so as to force the desired voltage at the bit line MBL.

Figure 6:
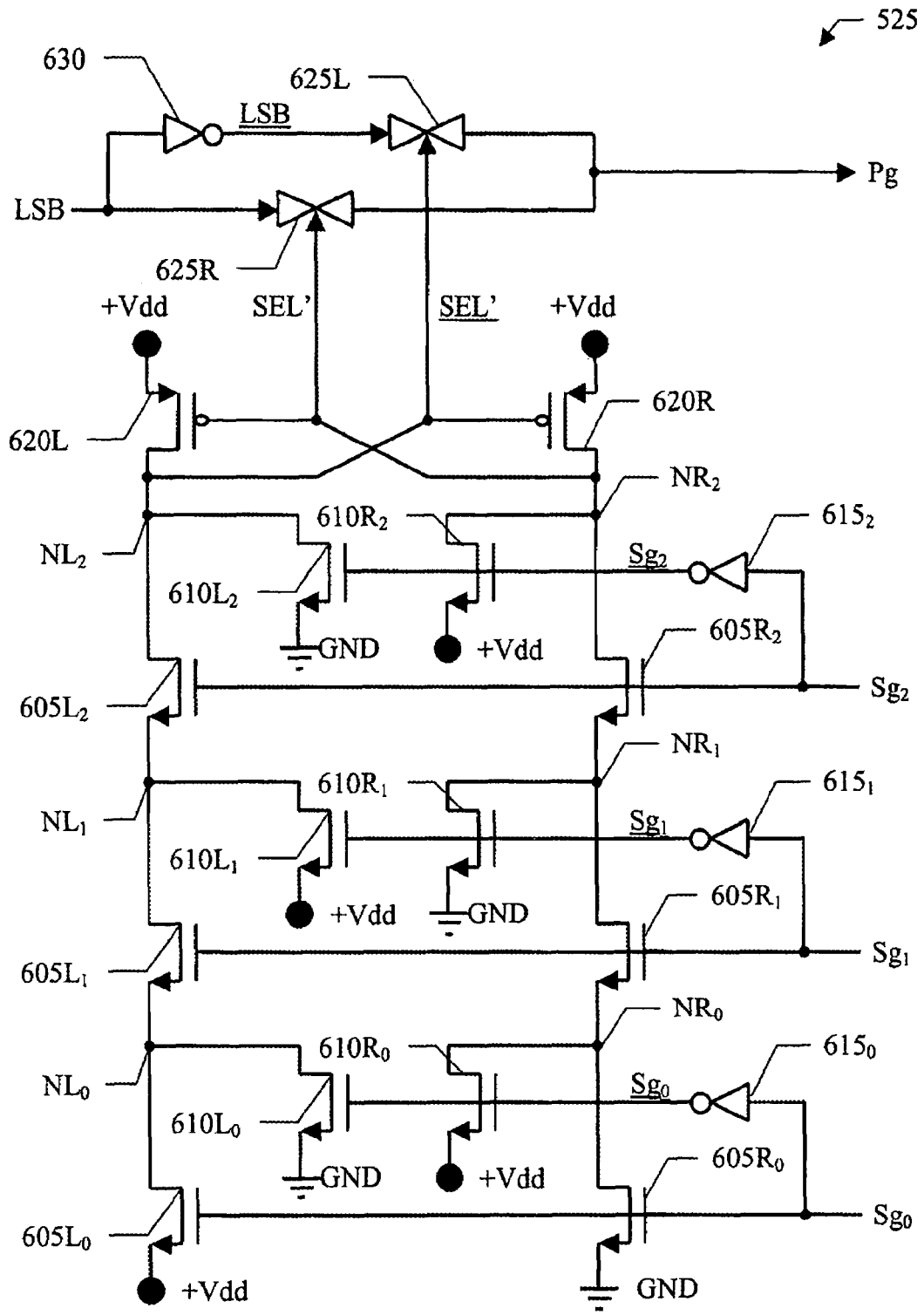
FIG. 6 illustrates a circuit scheme of a pulser of the control unit according to an embodiment of the invention.

With reference now to FIG. 6, the pulser 525 of the above-described control unit includes a stage for each sensing bit $Sg_i$. The generic stage has a right branch formed by two NMOS transistors $605R_i$ and $610R_i$, and a left branch formed by two NMOS transistors $605L_i$ and $610L_i$. Particularly, the gate terminals of the transistors $605R_i$ and $605L_i$ receive the (latched) sensing bit $Sg_i$, whereas the gate terminals of the transistors $610R_i$ and $610L_i$ receive its inverted value (denoted with $\overline{RSg_i}$) through an inverter $615_i$. The drain terminals of the transistors $605R_i$ and $610R_i$ are connected together to define a node $NR_i$, whereas the drain terminals of the transistors $605L_i$ and $610L_i$ are connected together to define a node $NL_i$. In each stage different from the first one (i>0), the source terminal of the transistor $605R_i$ is connected to the node $NR_{i-1}$ and the source terminal of the transistor $605L_i$ is connected to the node $NL_{i-1}$ of the previous stage; in the first stage (i=0), the source terminal of the transistor $605R_0$ is connected to the ground terminal GND and the source terminal of the transistor $605L_0$ is connected to a terminal providing the power supply voltage +Vdd. In each even stage (i.e., i=0,2 in the example at issue), the source terminal of the transistor $610R_i$ receives the power supply voltage +Vdd and the source terminal of the transistor $610L_i$ receives the ground voltage GND; conversely, in each odd stage (i.e., i=1 in the example at issue), the source terminal of the transistor $610R_i$ receives the ground voltage GND and the source terminal of the transistor $610R_i$ receives the power supply voltage +Vdd.

The pulser 525 further includes a latch formed by two PMOS transistors 620R and 620L. Particularly, the transistor 620R has the drain terminal connected to the node $NR_2$ and the transistor 620L has the drain terminal connected to the node $NL_2$ of the last stage. The gate terminal of the transistor 620R is connected to the drain terminal of the transistor 620L, and the gate terminal of the transistor 620L is connected to the drain terminal of the transistor 620R. The source terminals of both the transistors 620R and 620L receive the power supply voltage +Vdd.

The drain terminal of the transistor 620R provides a selection signal SEL', and the drain terminal of the transistor 620L provides its inverted value (denoted with $\overline{SEL'}$). The selection signal SEL' controls a pass gate 625R that receives the bit LSB, whereas the inverted selection signal $\overline{SEL'}$ controls a pass gate 625L that receives its inverted value (denoted with $\overline{LSB}$) through an inverter 630. The output terminals of the two pass gates 625R and 625L are connected together to provide the guard pulse Pg.

Considering now FIG. 6 together with FIG. 3b, at the beginning of the read operation the bit LSB is deasserted (since the running value DTc is 00), and then the inverted bit $\overline{LSB}$ is asserted; at the same time, all the sensing bits $Sg_i$ are deasserted. In this condition, all the transistors $605R_i, 605L_i$ are off, while all the transistors $610R_i, 610L_i$ are on (disregarding their threshold voltages). Therefore, in each even stage (i.e., i=0,2) the node $NR_i$ is at the power supply voltage +Vdd and the node $NL_i$ is at the ground voltage GND, whereas in each odd stage (i.e., i=1), the node $NR_i$ is at the ground voltage GND and he node $NL_i$ is at the power supply voltage +Vdd; as a result, the selection signal SEL' is asserted (node $NR_2$ at the power supply voltage +Vdd) and the inverted selection signal $\overline{SEL'}$ is deasserted (node $NL_2$ at the ground voltage GND). The pass gate 625R is then enabled to transfer the bit LSB (while the pass gate 625L is disabled), so that the guard pulse Pg is deasserted.

As soon as the running value DTc changes (time $tr_2$), the bit LSB toggles so that the bit LSB becomes asserted and the inverted bit LSB become deasserted; as a result, the guard pulse Pg is automatically asserted. Later on, the sensing bit $Sg_2$ is asserted as well (time $tg_2$); therefore, the transistors 605R$_2$,605L$_2$ turn on and the transistors 605L$_2$,605R$_2$ turn off. The node NR$_2$ is then connected to the node NR$_1$, and the node NL$_2$ is connected to the node NL$_1$; therefore, from now on the stage associated with the sensing bit Sg$_2$ becomes completely opaque to the operation of the pulser 525. In this condition, the selection signal SEL' is deasserted (node NR$_2$ at the ground voltage GND) and the inverted selection signal SEL' is asserted (node NL$_2$ at the power supply voltage +Vdd). The pass gate 625L is then enabled (instead of the pass gate 625R), now transferring the inverted bit LSB that deasserts the guard pulse Pg. The same operations described above are repeated at any next changes of the running value DTc and at the assertions of the corresponding sensing bits Sgi.

Figure 7:
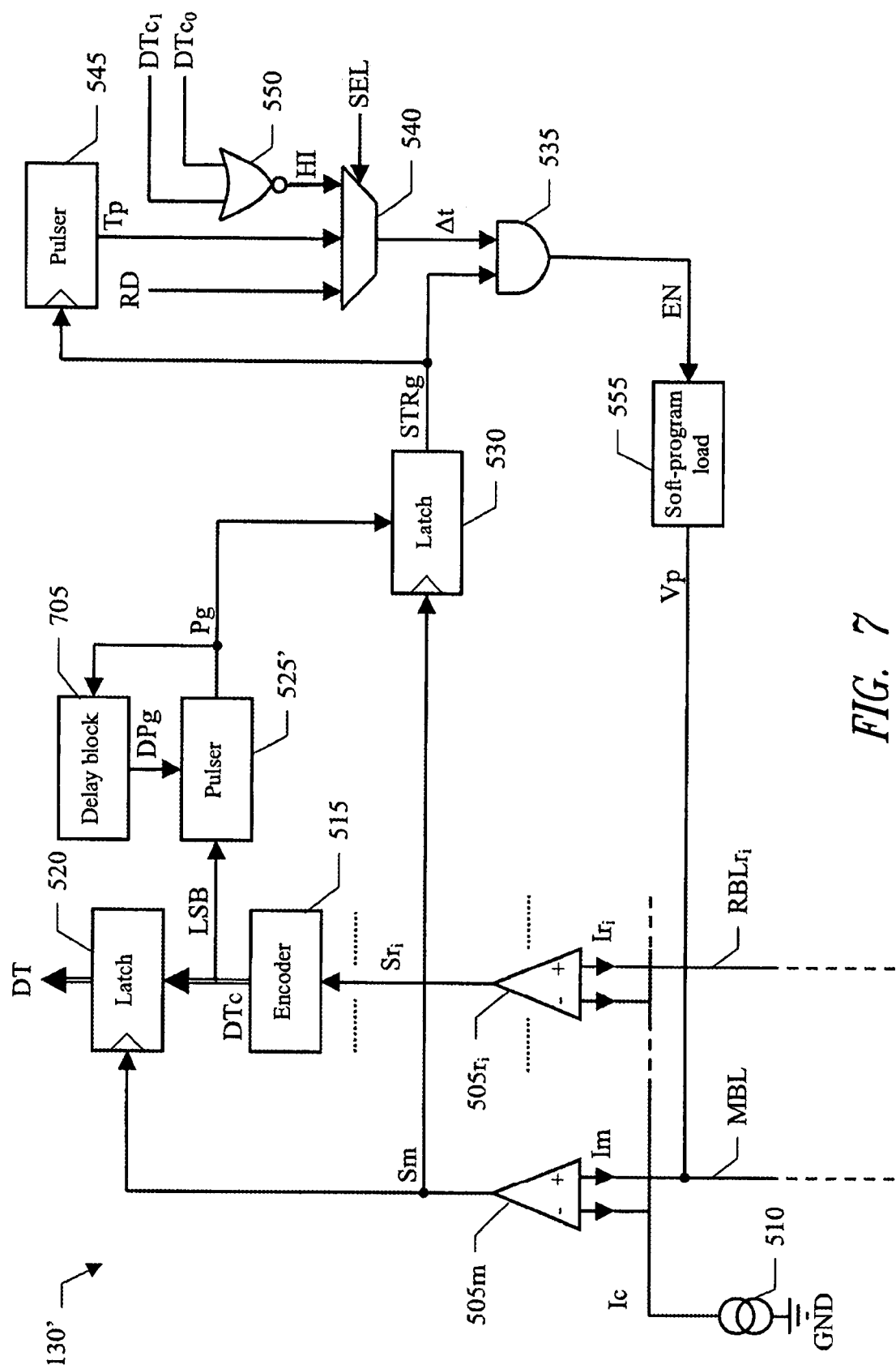
FIG. 7 is a schematic block diagram of the same control unit according to a different embodiment of the invention.

An alternative implementation of the control unit of the memory device is illustrated in FIG. 7 (this implementation is differentiated by adding an apex to its reference, i.e., 130'); for the sake of simplicity, the elements corresponding to the ones shown in the FIG. 5 are denoted with the same references and their explanation will be omitted.

In this case, the memory device does not include any guard reference cell; on the contrary, the same function is emulated by exploiting the read reference cells RCr$_i$ themselves. According to one embodiment, the guard pulse Pg (from a different pulser denoted with 525') is also applied to a delay block 705. The delay block 705 returns the same signal (denoted with DPg) to the pulser 525' with a predetermined delay. The delay is set to a value (for example, about 0.2-2 ns) corresponding to a voltage difference along the biasing ramp Vb of 20-200 mV (assuming a slope of $100 \cdot 10^6$ V/s); preferably, trimming elements (not shown in the figure) are used to regulate this delay to the desired value.

As a result, the delayed guard pulse DPg is asserted (with its delay) after each assertion of the guard pulse Pg, i.e., after the assertion of each sensing bit Sr$_i$ indicating the turn on of the corresponding read reference cell RCr$_i$. In other words, the assertion of the delayed guard pulse DPg occurs when the biasing ramp Vb has reached a value slightly higher than the threshold voltage of the read reference cell RCr$_i$ (i.e., the corresponding read reference Vr$_i$); therefore, the assertion of the delayed guard pulse DPg emulates the turn on of another reference cell with a slightly higher threshold voltage, which can be set to the desired guard reference Vg$_i$ (trimming the delay accordingly). This technique is described in greater detail in the co-pending European patent application No. EP05101660.8 filed on 3 Mar. 2005 (the entire disclosure of which is herein incorporated by reference).

The pulser 525' asserts the guard pulse Pg whenever the bit LSB toggles (when the running value DTc changes following the turn on of a next read reference cell RCr$_i$) up to the assertion of the delayed guard pulse DPg (emulating the turn on of the corresponding guard reference cell). Therefore, the operation of the control unit 130' is exactly the same as the one described above with reference to FIG. 5.

The proposed implementation simplifies the structure of the memory device (since the number of reference cells is now reduced). This has a beneficial impact on the testing time required to trim the reference cells. Moreover, the difference between the read references and the corresponding guard references can be defined with a very high accuracy (since any change of the threshold voltages of the read reference cells only shifts the (read/guard) references, but it is completely immaterial to their differences.

Figure 8:
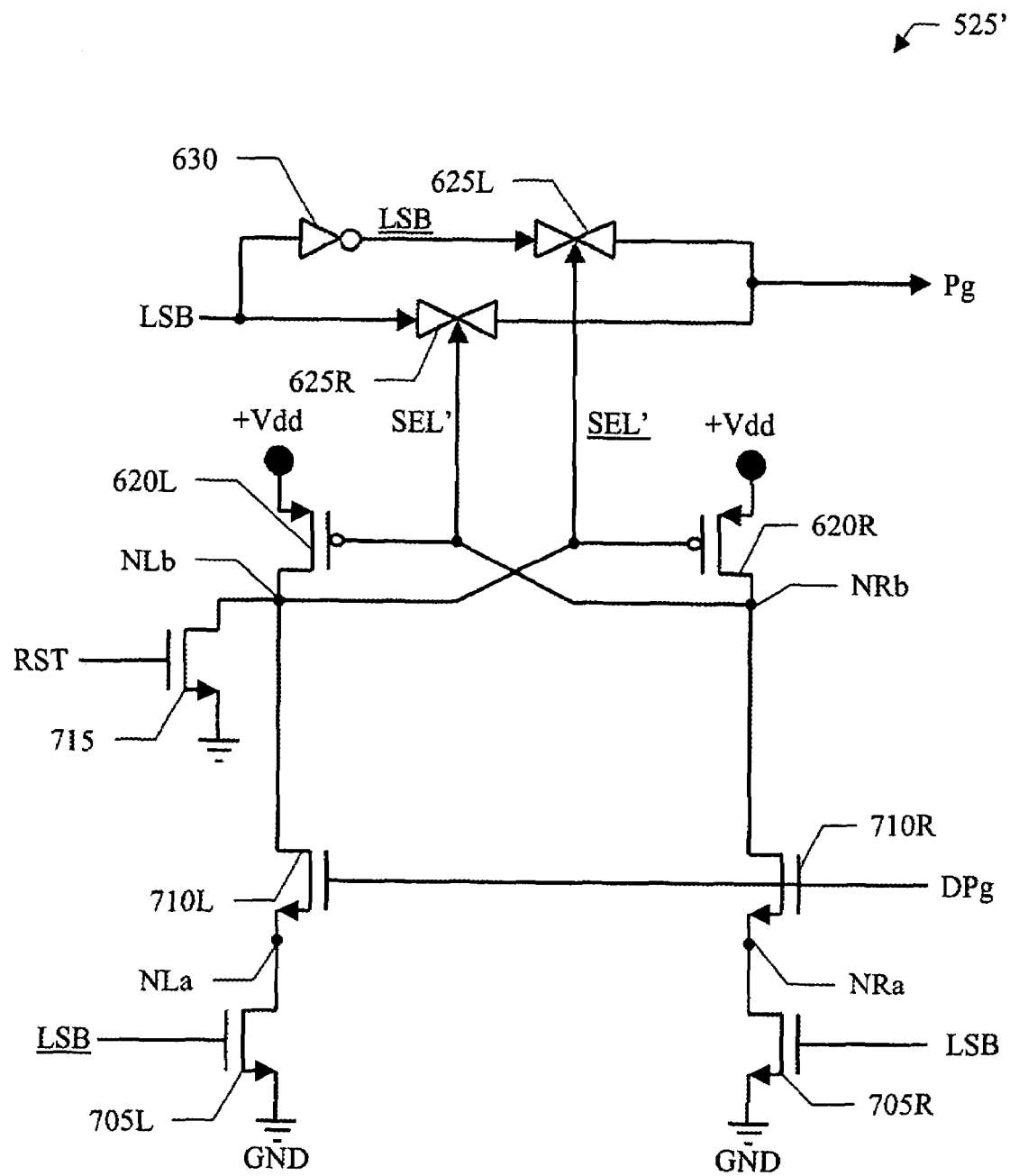
FIG. 8 illustrates a circuit scheme of another pulser of the control unit according to a different embodiment of the invention.

A possible structure of the pulser 525' suitable to be used in the above-described control unit is shown in FIG. 8; as above, the elements corresponding to the ones shown in FIG. 6 are denoted with the same references and their explanation will be omitted.

Particularly, the pulser 525' now includes a (single-stage) right branch formed by two NMOS transistors 705R and 710R, and a left branch formed by two NMOS transistors 705L and 710L. Particularly, the gate terminal of the transistor 705R receives the bit LSB, whereas the gate terminal of the transistor 705L receives the inverted bit LSB; the source terminals of both the transistors 705R and 705L receives the ground voltage GND. The drain terminal of the transistor 705R is connected to the source terminal of the transistor 710R to define a node NRa, and the drain terminal of the transistor 705L is connected to the source terminal of the transistor 710L to define a node NLa. The gate terminals of both the transistors 710R and 710L receive the delayed guard pulse DPg. The drain terminal of the transistor 710R defines a node NRb that is connected to the drain terminal of the transistor 620R, and the drain terminal of the transistor 710L defines a node NLb that is connected to the drain terminal of the transistor 620L (with the remaining part of the pulser 525' that has the same structure described above). The pulser 525' further includes another NMOS transistor 715. The transistor 715 has the source terminal that receives the ground voltage GND, and the drain terminal that is connected to the node NLb; the gate terminal of the transistor 715 receives a reset signal RST.

At the beginning of the read operation, the reset signal RST is asserted for a short period; in this way, the transistor 715 turns on and brought the node NLb to the ground voltage GND. As a result, the transistor 620R turns on (selection signal SEL' asserted), while the transistor 620L remains off (inverted selection signal SEL' deasserted). At the same time, the bit LSB is deasserted and the inverted bit LSB is asserted; therefore, the pass gate 625R is enabled to transfer the bit LSB (while the pass gate 625L is disabled), so that the guard pulse Pg is deasserted. Moreover, the transistor 705R is off and the transistor 705L is on (bringing the node NLa to the ground voltage GND). The delayed guard pulse DPg is deasserted as well; therefore, the transistors 710R and 710L are off so as not to affect the condition of the latch 620R,620L.

Whenever the running value DTc changes (because a generic read reference cell RCr$_i$ turns on) the bit LSB toggles, so that the bit LSB becomes asserted and the inverted bit LSB become deasserted; as a result, the guard pulse Pg is automatically asserted. At the same time, the transistor 705R turns on (bringing the node NRa to the ground voltage GND) and the transistor 705L turns off. The delayed guard pulse DPg is asserted as well after the desired delay, so as to turn on the transistors 710R and 710L. In this condition, the node NRb is connected to the node NRa, and it is brought to the ground voltage GND. As a result, the transistor 620L turns on and the inverted selection signal SEL' is asserted, while the transistor 620R turns off and the selection signal SEL' is deasserted. The pass gate 625L is then enabled (instead of the pass gate 625R), now transferring the inverted bit LSB that deasserts the guard pulse Pg. The same operations described above are repeated at any next changes of the running value DTc.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, the numerical examples described above are merely illustrative and must not be interpreted in a limitative manner.

Similar considerations apply if the memory device has another structure or includes equivalent units. Particularly, the application of the proposed solution to different non-volatile memory devices (such as $E^2$PROMs, flash memories with NAND architecture, phase-change memories), or even to volatile memory devices (such as DRAMs) is contemplated. Moreover, the modification of the above-described circuits for a memory device operating with a different number of levels (even not a power of 2) is straightforward; in any case, the technical idea of the invention may also be applied to a standard memory device, wherein each memory cell stores a single bit.

Alternatively, the biasing ramp may be generated in another way (for example, by applying a direct current to the selected memory cells and to the reference cells); similar considerations apply if the biasing voltage has a different monotone time pattern (either increasing or decreasing over time). Moreover, the values stored in the memory cells can be determined with equivalent techniques based on the temporal order of their turning on with respect to the ones of the reference cells (for example, by latching an indication of the time at which each memory/reference cell turns on).

It is emphasized that the proposed solution is suitable to be applied to any reading of the memory cells. For example, the same technique may be implemented during a program-verify operation (when the memory cells are read to determine whether the desired logical values have been correctly written). Alternatively, it is also contemplated the possibility of reading all the memory cells (with their refreshing) in response to a dedicated command; for example, this command may be invoked at the power-on of the memory device (preferably disabling the output of the logical values read from the memory cells).

Similar considerations apply if the soft-program pulse has a different value and/or shape. In any case, although in the preceding description great emphasis has been given to a refresh operation based on a soft-program pulse, it should be noted that the proposed solution has a more general applicability to any writing of the memory cells; particularly, if the memory device supports the erasure at the level of single memory cells, it is also possible to verify whether electrical charge has been injected into their floating gates (with an undesired programming thereof), and then apply a soft-erase pulse when it is necessary.

In a different embodiment of the invention, the refresh operation is prevented (for a predetermined period) at the power-on of the memory device (when the required high voltage provided by the charge pump may be not available yet); however, the generation of the soft-program pulse from the power supply voltage directly is not excluded (taking into account that the soft-program pulse generally has a lower value than the very high one required during an actual programming of the memory cells). Moreover, nothing prevents making the guard strobe available outside the memory device to signal the occurrence of any warning condition.

Without departing from the principles of the invention, it is also possible to implement a blind refresh operation (without any verification of the warning condition of the memory cells), for example, by exploiting a soft-program pulse that is shorter and/or lower (especially in standard memory devices wherein no risk exists of writing a wrong logical value by reaching the next level of the threshold voltage).

Similar considerations apply if the entering of the warning conditions (in the implementation based on the guard reference cells) is detected in a similar way or by means of equivalent circuits.

Likewise, the emulation of the guard reference cells may be obtained with alternative techniques (for example, by increasing/decreasing the latched time at which each memory and/or reference cell turns on); in this case as well, equivalent circuits may be exploited.

Even though in the preceding description reference has been made to specific techniques for generating the soft-program pulse, they are not to be interpreted in a limitative manner. For example, in a different embodiment of the invention it is possible to adapt the value of the soft-program pulse according to the actual condition of the memory cell (such as increasing it for the higher threshold voltages to compensate the reduced effectiveness of the refresh operation). Alternatively, the soft-program pulse may be maintained after the completion of the biasing ramp (such as up to the submission of a next command for accessing the memory device); in this case, it would also be possible to verify the condition of the memory cell after the refresh operation. Of course, it not strictly necessary for the memory device to support all the proposed techniques at the same time (with the structure of the control unit that is simplified accordingly when a single one of them is implemented).

It should be readily apparent that the proposed solution may be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages form. Moreover, the circuit may be integrated with other chips in intermediate products (such as mother boards). In any case, the integrated circuit is suitable to be used in complex systems (such as mobile phones).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A refresh circuit for refreshing a memory device, the refresh circuit comprising:
   reading means for reading a set of memory cells, the reading means including means for applying a biasing voltage having a substantially monotone time pattern to the memory cells and to a set of reference cells, each one of the reference cells having a reference threshold voltage;
   means for detecting reaching of a comparison current by cell currents of the memory cells, respectively and by reference currents of the reference cells, respectively;

means for determining a condition of each memory cell according to a temporal relation of the reaching of the comparison current by the cell current of the memory cell and the reference currents;

writing means for applying a writing voltage to at least a selected one of the memory cells; and control means for enabling the writing means during at least part of the application of the biasing voltage after determining the condition of each memory cell.

2. The refresh circuit according to claim 1, wherein the control means includes verifying means for detecting a warning condition of each memory cell when a difference between a corresponding threshold voltage and a reference threshold voltage is lower than a safe margin, the memory cells being selected for the application of the writing voltage in response to the detection of the warning condition.

3. The refresh circuit according to claim 2, wherein the reading means further includes means for applying the biasing voltage to a set of further reference cells each one of the further reference cells having a further reference threshold voltage, a difference between each further reference threshold voltage and a corresponding reference threshold voltage being equal to the safe margin, and wherein the verifying means includes means for detecting the reaching of the comparison current by a further reference current of each further reference cell, and means for determining the warning condition of each memory cell according to a temporal relation of the reaching of the comparison current by the cell current of the memory cell, the reference current and the further reference current.

4. The refresh circuit according to claim 3, wherein the means for determining the warning condition includes:

means for providing a guard signal asserted when the biasing voltage is comprised between the reference threshold voltage and a corresponding further reference threshold voltage; and means for latching the guard signal in response to the reaching of the comparison current by the cell current, the means for providing the guard signal including means for setting the guard signal alternatively to a bit changing between each pair of consecutive logical values stored in one of the memory cells or to said bit being inverted, and means for exchanging the bit and the inverted bit in response to the detection of the reaching of the comparison current by each further reference current.

5. The refresh circuit according to claim 2, wherein the verifying means includes:

means for delaying the detection of the reaching of the comparison current by each reference current according to a delay, a change of the biasing voltage corresponding to the delay being equal to the safe margin; and means for determining the warning condition of each memory cell according to a temporal relation of the reaching of the comparison current by the cell current of the memory cell, the reaching of the comparison current by the reference currents, and the delayed detection of the reaching of the comparison current by the reference currents.

6. The refresh circuit according to claim 5, wherein the means for determining the warning condition includes:

means for providing a guard signal asserted when the biasing voltage is comprised between the reference threshold voltage and a corresponding further reference threshold voltage, the means for delaying the detection including means for delaying the guard signal, and means for latching the guard signal in response to the reaching of the comparison current by the cell current, the means for providing the guard signal including means for setting the guard signal alternatively to a bit changing between each pair of consecutive logical values stored in one of the memory cells or to said bit being inverted, and means for exchanging the bit and the inverted bit in response to each assertion of the delayed guard signal.

7. The refresh circuit according to claim 2, wherein the control means includes means for enabling the writing means from the detection of the warning condition to a completion of the reading of the set of memory cells.

8. The refresh circuit according to claim 2, wherein the control means includes means for enabling the writing means for a time interval from the detection of the warning condition.

9. The refresh circuit according to claim 2, wherein the control means includes means for enabling the writing means from the detection of the reaching of the comparison current by the reference current of a last reference cell having a highest threshold voltage in absolute value to a completion of the reading of the set of memory cells.

10. A memory device comprising:

a plurality of memory cells;

means for addressing a set of memory cells;

a set of reference cells each one having a reference threshold voltage; and a refresh circuit having:

reading means for reading the plurality of memory cells, the reading means including means for applying a biasing voltage having a substantially monotone time pattern to the plurality of memory cells and to the set of reference cells, means for detecting reaching of a comparison current by cell currents of the plurality of memory cells, respectively and by reference currents of the reference cells, respectively, means for determining a condition of each memory cell according to a temporal relation of the reaching of the comparison current by the cell current of the memory cell and the reference currents, writing means for applying a writing voltage to at least a selected one of the plurality of memory cells, and control means for enabling the writing means during at least part of the application of the biasing voltage after determining the condition of each memory cell.

11. The memory device of claim 10 wherein the control means includes verifying means for detecting a warning condition of each memory cell when a difference between a corresponding threshold voltage and a reference threshold voltage is lower than a safe margin, the plurality of memory cells being selected for applying the writing voltage in response to the detection of the warning condition.

12. The memory device of claim 11 wherein the reading means further includes means for applying the biasing voltage to a set of further reference cells each one of the set of further reference cells having a further reference threshold voltage, a difference between each further reference threshold voltage and a corresponding reference threshold voltage being equal to the safe margin, and wherein the verifying means includes means for detecting the reaching of the comparison current by a further reference current of each further reference cell, and means for determining the warning condition of each memory cell according to a temporal relation of the reaching of the comparison current by the cell current of the memory cell, the reference current and the further reference current.

13. The memory device of claim 12 wherein the means for determining the warning condition includes:
    means for providing a guard signal asserted when the biasing voltage is comprised between the reference threshold voltage and a corresponding further reference threshold voltage; and
    means for latching the guard signal in response to the reaching of the comparison current by the cell current, the means for providing the guard signal including means for setting the guard signal alternatively to a bit changing between each pair of consecutive logical values stored in one of the memory cells or to said bit being inverted, and means for exchanging the bit and the inverted bit in response to the detection of the reaching of the comparison current by each further reference current.

14. A method of refreshing a memory device, the method comprising:
    reading a set of memory cells, the step of reading including applying a biasing voltage having a substantially monotone time pattern to the memory cells and to a set of reference cells each one of the reference cells having a reference threshold voltage;
    detecting reaching of a comparison current by cell currents of the memory cells, respectively and by reference currents of the reference cells, respectively;
    determining a condition of each memory cell according to a temporal relation of the reaching of the comparison current by the cell current of the memory cell and the reference currents;
    applying a writing voltage to at least a selected one of the memory cells; and
    enabling the application of the writing voltage during at least part of the application of the biasing voltage after determining the condition of each memory cell.

15. The method of claim 14, further comprising:
    detecting a warning condition of each memory cell when a difference between a corresponding threshold voltage and a reference threshold voltage is lower than a safe margin, the memory cells being selected for the application of the writing voltage in response to detecting the warning condition.

16. The method of claim 15 wherein reading the set of memory cells includes:
    applying the biasing voltage to a set of further reference cells each one of the further reference cells having a further reference threshold voltage, a difference between each further reference threshold voltage and a corresponding reference threshold voltage being equal to the safe margin.

17. The method of claim 16 wherein detecting the warning condition includes detecting the reaching of the comparison current by a further reference current of each further reference cell, and determining the warning condition of each memory cell according to a temporal relation of the reaching of the comparison current by the cell current of the memory cell, the reference current and the further reference current.

18. The method of claim 17 wherein determining the warning condition includes:
    providing a guard signal asserted when the biasing voltage is comprised between the reference threshold voltage and a corresponding further reference threshold voltage; and
    latching the guard signal in response to the reaching of the comparison current by the cell current, providing the guard signal includes setting the guard signal alternatively to a bit changing between each pair of consecutive logical values stored in one of the memory cells or to said bit being inverted, and exchanging the bit and the inverted bit in response to the detection of the reaching of the comparison current by each further reference current.

19. A memory device comprising:
    a plurality of memory cells;
    a decoder to address the plurality of memory cells;
    a set of reference cells having reference threshold voltages, respectively; and
    a refresh circuit including:
    a reading circuit structured to read the plurality of memory cells, the reading circuit including a biasing circuit applying a biasing voltage with a substantially monotone time pattern to the plurality of memory cells and to the set of reference cells,
    a sense amplifier structured to detect whether respective cell currents of the memory cells and respective reference currents of the reference cells exceed a comparison current,
    an encoder structured to determine respective current logical values to be stored in the memory cells, respectively, according to respective temporal relations of the comparison current with the respective cell current and reference current,
    a soft-program load structured to apply a writing voltage to one of the plurality of memory cells, and
    a control circuit structured to enable the soft-program load during at least part of the application of the biasing voltage after the determination of the current logical values to be stored in the memory cells.

20. The memory device of claim 19 wherein the control circuit includes a detection circuit operable to detect a warning condition of each of the plurality of memory cells when a difference between a corresponding threshold voltage and a reference threshold voltage is lower than a safe margin, the plurality of memory cells being selected for having the writing voltage applied therein in response to the detection of the warning condition.

21. The memory device of claim 20 wherein the reading circuit further includes a further biasing circuit operable to apply the biasing voltage to a set of further reference cells each one of the further reference cells having a further reference threshold voltage, a difference between each further reference threshold voltage and a corresponding reference threshold voltage being equal to the safe margin, and wherein the detection circuit includes a further detection circuit operable to detect the reaching of the comparison current by a further reference current of each further reference cell, and a determination circuit operable to determine the warning condition of each of the plurality of memory cells according to a temporal relation of the reaching of the comparison current by the cell current of the memory cell, the reference current and the further reference current.

* * * * *

UNITED STATES PATENT AND TRADEMARK OFFICE
CERTIFICATE OF CORRECTION

PATENT NO. : 7,417,900 B2 Page 1 of 1
APPLICATION NO. : 11/695552
DATED : August 26, 2008
INVENTOR(S) : Paolo Rolandi et al.

It is certified that error appears in the above-identified patent and that said Letters Patent is hereby corrected as shown below:

Title Page
Item (30) Foreign Application Priority Data should be included to read as -- ...Foreign Application Priority Data...April 3, 2006...(EP)......06112157.0 --

Signed and Sealed this

Twenty-sixth Day of January, 2010

David J. Kappos
*Director of the United States Patent and Trademark Office*